United States Patent
Walsh et al.

[11] Patent Number: 6,079,565
[45] Date of Patent: Jun. 27, 2000

[54] CLIPLESS TRAY

[75] Inventors: Matthew E. Walsh, Chanhassen; Joy A. Duban-Hu, Burnsville, both of Minn.

[73] Assignee: Flouroware, Inc., Chaska, Minn.

[21] Appl. No.: 09/221,745

[22] Filed: Dec. 28, 1998

[51] Int. Cl.⁷ .................................................. B65D 73/02
[52] U.S. Cl. ...................................... 206/725; 220/345.2
[58] Field of Search .................................. 206/722, 724, 206/725; 220/4.21, 4.24, 287, 345.1, 345.2, 345.4, 351

[56] References Cited

U.S. PATENT DOCUMENTS

| | | | |
|---|---|---|---|
| 4,126,224 | 11/1978 | Laauwe et al. | 220/345.4 |
| 4,470,518 | 9/1984 | Stein | 220/345.2 |
| 4,867,308 | 9/1989 | Crawford et al. | |
| 4,958,053 | 9/1990 | Boeckmann et al. | |
| 5,129,538 | 7/1992 | Bennett | 220/345.2 |
| 5,203,452 | 4/1993 | Small et al. | |
| 5,234,104 | 8/1993 | Schulte et al. | |
| 5,310,076 | 5/1994 | Burton et al. | 206/725 |
| 5,333,733 | 8/1994 | Murata | |
| 5,547,082 | 8/1996 | Royer et al. | |
| 5,551,572 | 9/1996 | Nemoto | |
| 5,597,074 | 1/1997 | Ko | 206/725 |
| 5,758,776 | 6/1998 | Slocum et al. | |
| 5,772,038 | 6/1998 | Murata et al. | |
| 5,996,831 | 12/1999 | Teok | 220/345.4 |

*Primary Examiner*—David T. Fidei
*Attorney, Agent, or Firm*—Douglas J. Christensen

[57] ABSTRACT

A semi-conductor chip tray and associated retainer and method of use. The tray is provided with a plurality of side notches and tabs which are configured to admit and engage a plurality of posts and flanges, respectively, which extend from the retainer. The tray and retainer are attached to each other by setting the retainer on top of the tray in a linearly offset manner wherein the posts of the retainer extend into the corresponding side notches of the tray. The retainer is then aligned with the tray in a relative sliding motion. During alignment, the flanges of the retainer engage the tabs of the tray to secure the retainer to the tray. The tabs of the tray are provided with recesses which are configured to snugly receive projections which extend from the flanges of the retainer, thus allowing the retainer to be locked in a predetermined position as the retainer and lid are aligned. This locking feature facilitates alignment and prevents inadvertent or accidental displacement between the retainer and the tray.

18 Claims, 4 Drawing Sheets

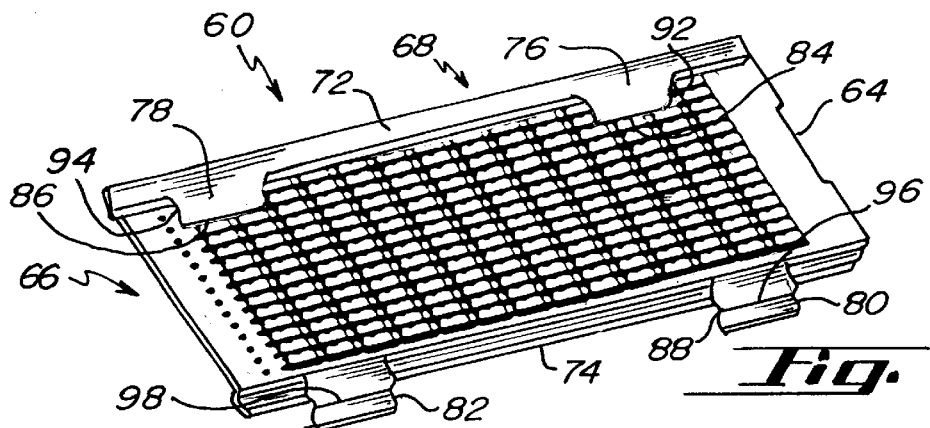
_Fig. 7._
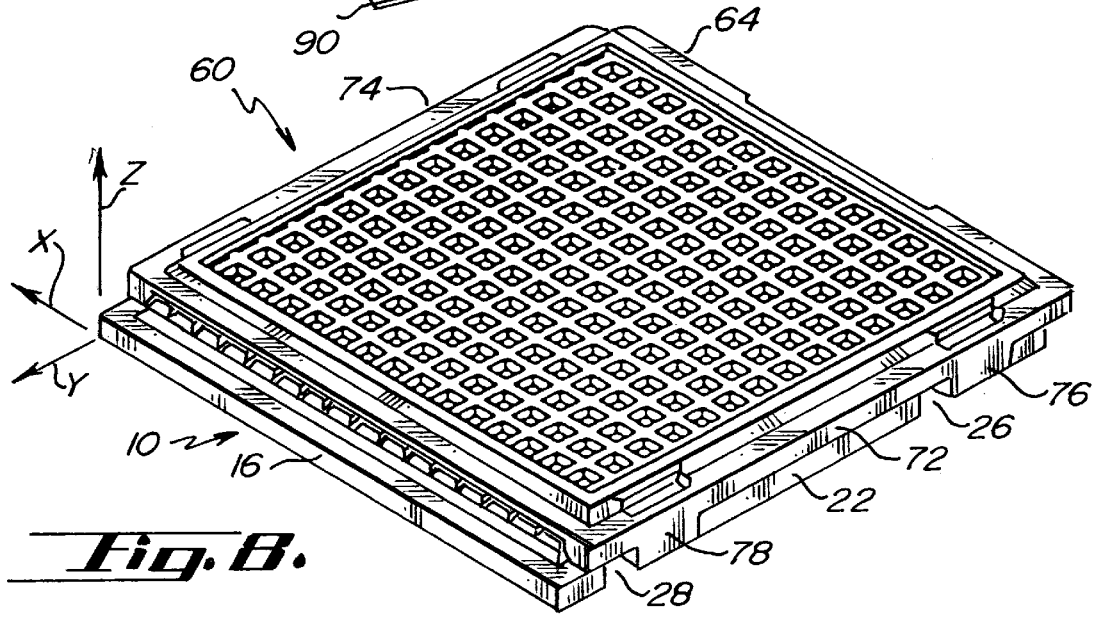
_Fig. 8._
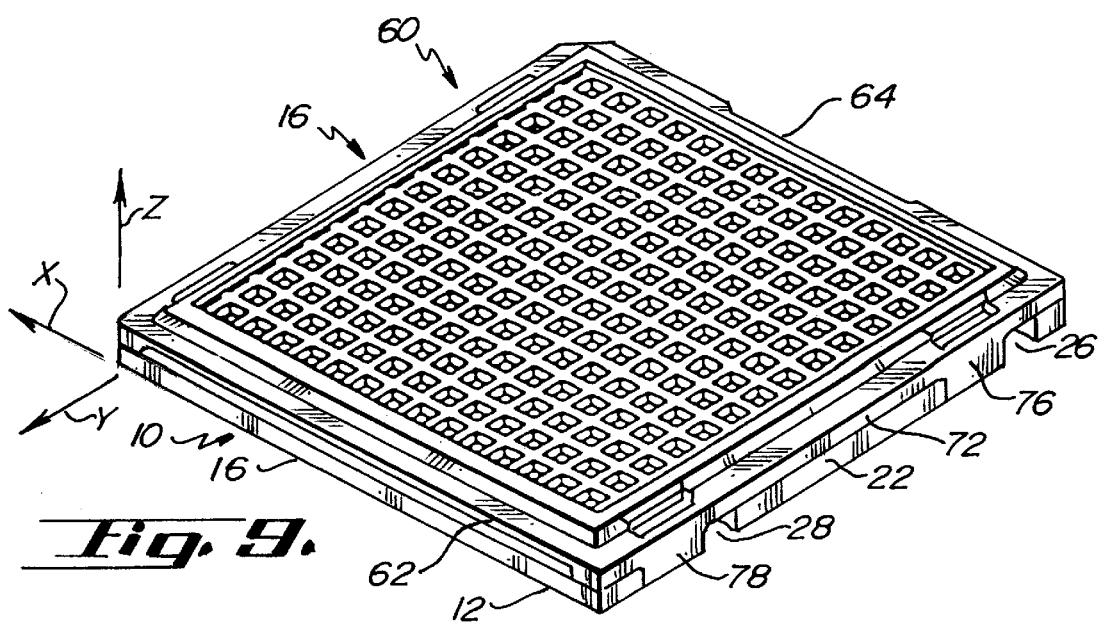
_Fig. 9._

CLIPLESS TRAY

BACKGROUND OF THE INVENTION

This invention relates to carriers used in the semiconductor fabrication industry, and in particular to tray carriers with covers.

Trays are used in the micro-electronic industry for storing, transporting, fabricating, and generally holding small components such as, but not limited to, semi-conductor chips, ferrite heads, magnetic resonant read heads, thin film heads, bare dies, bump dies, substrates, optical devices, laser diodes, preforms, and miscellaneous mechanical articles such as springs and lenses.

Semi-conductor chips (chips) are illustrative of the issues associated with handling the above-defined components. Semi-conductor chips are very small electronic devices which, for purposes of economy and scale, are manufactured en-masse from a larger semi-conductor wafer (wafer). Typically, a single wafer will yield several tens or hundreds of chips. Often, after the wafer has been segmented into individual chips, additional processing is necessary. This usually entails transporting a plurality of chips from one workstation to another for processing by specialized equipment.

To facilitate processing of chips on a large scale, specialized carriers called matrix trays (trays) have been developed. These trays are designed to hold a plurality of chips in individual processing cells or pockets arranged in a matrix or grid. The size of the matrix or grid can range from two to several hundred, depending upon the size of the chips to be processed.

In order to prevent chips from being dislodged, misaligned, or lost from their pockets or cells during processing and transport, retainers are used. Although the typical retainer is in the form of a cover, a second tray may function equally as well. Such retainer is usually placed on the tray so that it is coincident with the tray. The retainer is then attached to the tray by fasteners such as clips. These fasteners can take different shapes, depending upon the configuration and combination of trays and retainers. For example, the fasteners can be a pair of parallely aligned clips which traverse the retainer or tray and grip the tray and retainer at opposing edges. Or, the fastener may be a U-shaped frame with a channel into which the retainer and tray is slidingly inserted. Other fasteners that have been developed are capable of attaching different combinations of trays and trays with retainers to each other. For example, two trays and a cover, six trays and a cover, and two trays.

There are several problems associated with this way of retaining chips within a carrier tray. The clips may be lost or misplaced. They may be damaged or broken. They cannot be easily changed or modified to accommodate different combinations of trays and retainers. And, the ability to effectively fasten may diminish due to aging and abrasion.

Equally important is the problem of particle generation which may lead to chip contamination. Particles may be generated mechanically during clip attachment and removal, and particles may be generated chemically in reaction to various processing fluids. The problems of particle generation are variable because fasteners are manufactured from different materials such as plastic or metal.

SUMMARY OF THE INVENTION

The present invention solves the problems inherent to the above-mentioned chip carriers by providing a simple fastening system and method of attachment which eliminates the need for specialized clips. This is accomplished by providing the trays and retainers with integrally formed fastening elements. Each tray is provided with a plurality of side notches and tabs which are configured to admit and engage a plurality of posts and flanges, respectively, which extend from a retainer. The tray and retainer are attached to each other by setting the retainer on top of the tray in a linearly offset manner wherein the posts of the retainer extend into the corresponding side notches of the tray. The retainer is then aligned with the tray in a relative sliding motion. During alignment, the flanges of the retainer engage the tabs of the tray to secure the retainer to the tray. The tabs of the tray are provided with recesses which are configured to snugly receive projections which extend from the flanges of the retainer, thus allowing the retainer to be locked in a predetermined position as the retainer and lid are aligned. This locking feature facilitates alignment and prevents inadvertent or accidental displacement between the retainer and the tray.

In an alternative embodiment, each tray is provided with a plurality of side notches and tabs which are configured to admit and engage a plurality of posts and flanges, respectively, which extend from a retainer, as mentioned above. Each tray is also provided with a plurality of posts and flanges which extend therefrom in the manner of a retainer. This configuration enables one tray to function as a retainer. It also allows trays and a cover to be combined into a plurality of customized configurations.

It is significant to note that the undercuts, defined by posts and flanges, are typically formed by linearly extendable blocks which form part of a lower die. With the present invention, the process is considerably simplified. Here, the upper die is provided with orthogonally oriented extensions configured to provide the form of the undercuts. These extensions not only streamline the fabrication process, they create apertures for subsequent fabrication tooling.

A feature of the preferred embodiments of the invention is that the method of attachment of a retainer onto a tray is simplified and the need to maintain a selection of clips is eliminated.

Yet another feature is to optimize use of carrier trays by providing direct tray-to-tray connection.

Another feature of the invention is reduced fabrication steps and costs. For example, fabrication of interlocking elements on the flanges of the posts is simplified by the provision of appropriately sized and positioned die extensions. By eliminating the need for separately formed chips, the need to create the dies and fixtures necessary to form the clips is also eliminated.

Another feature of the invention is to minimize the generation of contaminants caused by abrasion and harsh chemical environments.

Additional objects, advantages, and features of the invention will be set forth in part in the description which follows, and in part will become apparent to those skilled in the art upon examination of the following or may be learned by practice of the invention. The objects and advantages of the invention may be realized and attained by means of the instrumentalities and combinations particularly pointed out in the appended claims.

BRIEF DESCRIPTION OF THE DRAWINGS

FIG. 7 is a perspective of the cover of FIG. 5 showing the bottom surface;

FIG. 8 is a perspective view of a cover placed onto a tray in a first seated position;

FIG. 9 is a perspective view of a cover placed onto the tray in a second seated position;

It is understood that the above figures are for illustrative purposes only and are not meant to limit the scope of the claimed invention.

DETAILED SPECIFICATION

Figure 1:
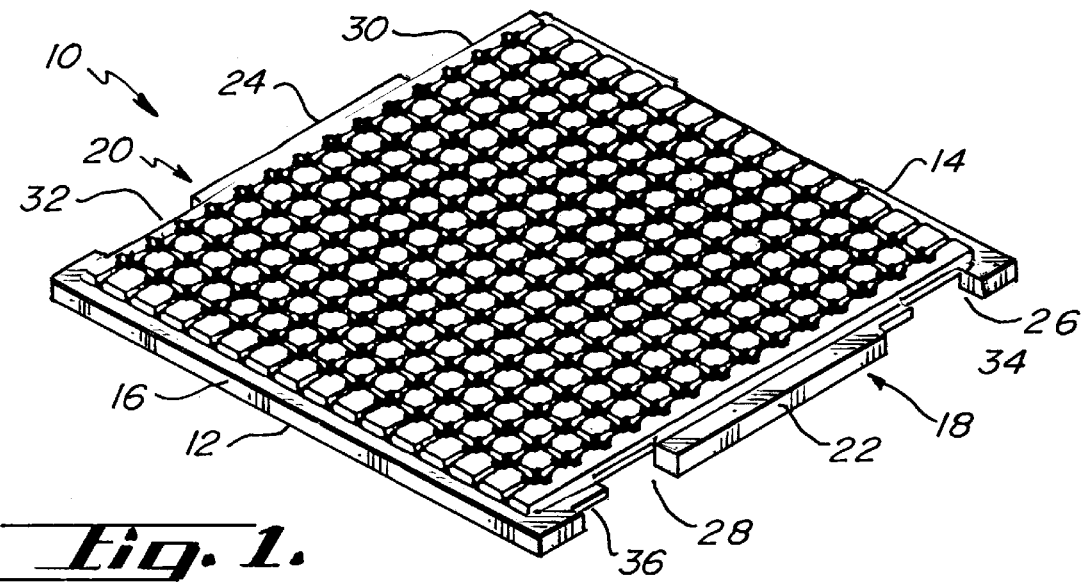
FIG. 1 is a perspective view of a tray of the present invention showing the top surface.
Figure 2:
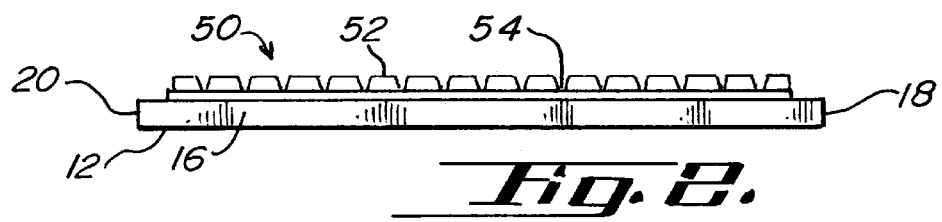
FIG. 2 is an end view of FIG. 1.
Figure 4:
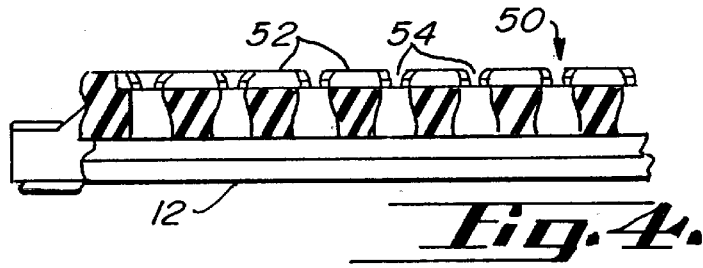
FIG. 4 is a partial, transverse sectional view of FIG. 3.

Referring to FIGS. 1, 2 and 4, an example of a chip carrier tray for processing and transporting a plurality of semiconductor chips is shown and generally designated by the numeral 10. The tray 10 comprises a first peripheral frame 12 having a first end 14, a second end 16, and sides 18, 20. Sides 18, 20 include rails 22, 24 and notches 26, 28, 30, and 32, located at the ends of rails 22 and 24, respectively. Tabs 34, 36, 38, and 40 project into notches 26, 28, 30, 32 for engagement with flanges (see FIG. 10). Note that the tabs 34, 36, 38, and 40 project in the same direction relative to the tray 10. Together, first end 14, second end 16 and the rails 22, 24 extend substantially around the perimeter of a chip support surface 50. The chip support surface 50 is of a conventional design and is depicted as a matrix of lands 52 which define pockets or cells 54 which hold individual chips. Referring to FIG. 2, the peripheral frame 12 forms a support base which is vertically offset with respect to a chip support surface 50. This creates a space or plenum beneath the chips to facilitate processing. It also enables chips to stand proud for easier placement and removal into pockets 54.

Figure 3:
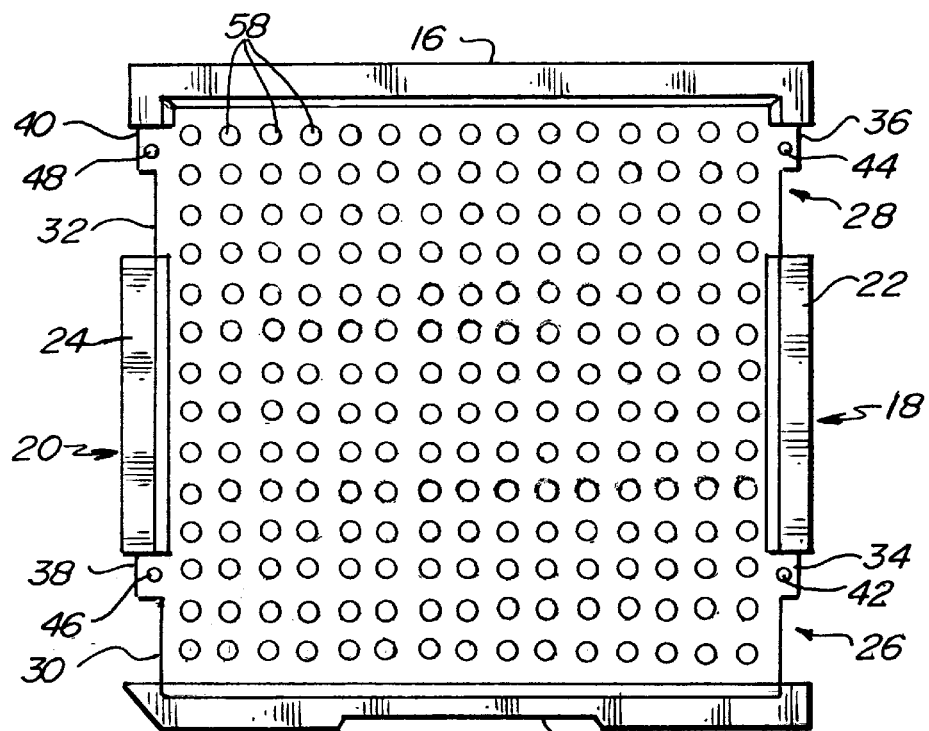
FIG. 3 is a bottom view of FIG. 1.

Referring to FIG. 3, tray 10 includes a bottom surface 56 which can function as a retainer, if desired. Although the bottom surface 56 shown in this embodiment includes a plurality of wash holes 58, the wash holes 58 do not form a part of this invention. Turning to sides 18 and 20, note that the tabs 34, 36, 38 and 40 include recesses or elements 42, 44, 46, and 48 which lockably engage projections or elements on flanges (see FIG. 10).

Figure 5:
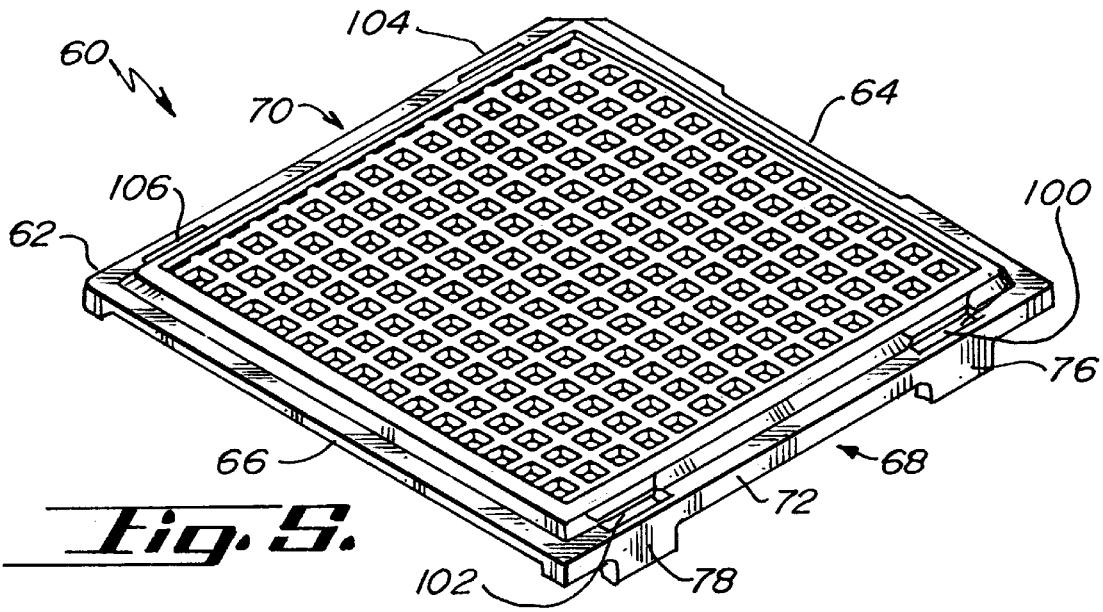
FIG. 5 is a perspective view of a retainer of the present invention showing the top surface.
Figure 6:
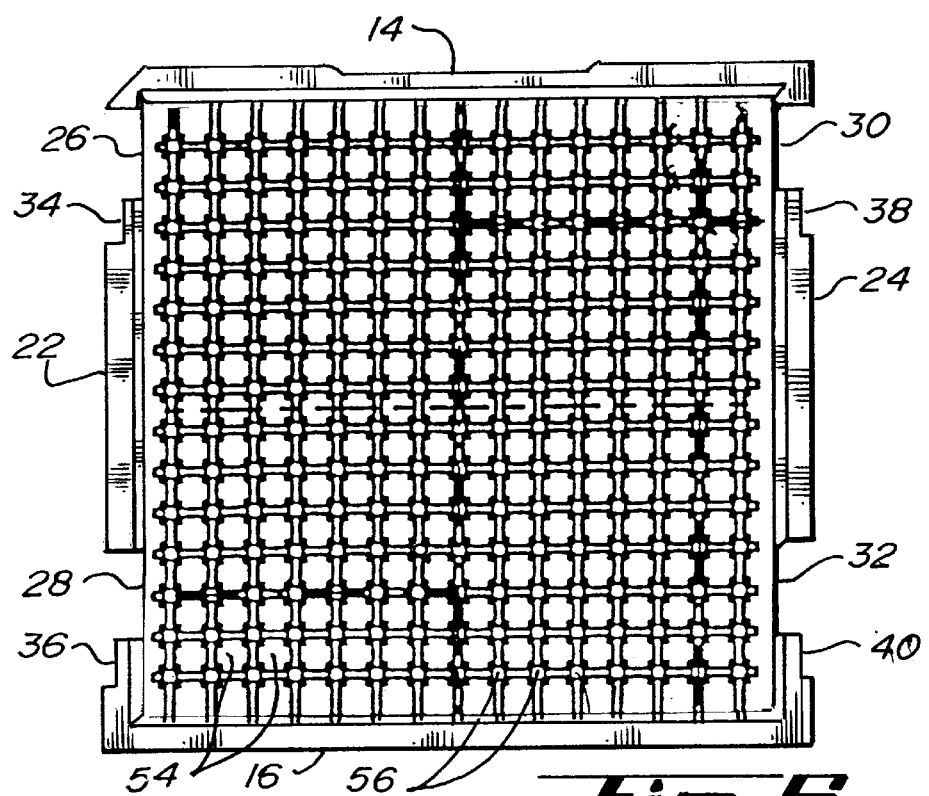
FIG. 6 is a top view of the tray of FIG. 1.

Referring to FIGS. 5 and 7, the retainer of the preferred embodiment is a cover 60. The cover 60 comprises a second peripheral frame 62 having a first end 64, a second end 66, and sides 68, 70. Sides 68, 70 include rails 72, 74 with posts 76, 78, 80, and 82 which extend orthogonally relative to the plane of the cover. The posts 76, 78, 80, and 82 have inwardly projecting flanges 84, 86, 88, and 90, with the posts and flanges defining oppositely facing undercuts 92, 94, 96, and 98. Adjacent to and inward of the posts 76, 78, 80, and 82 are apertures 100, 102, 104, and 106 which are formed during fabrication and into which fabrication tools may be inserted.

As with tray 10, the first end 64, second end 66 and the rails 72, 74 of cover 60 extend substantially around the perimeter of a chip retaining surface 116. The chip retaining surface 116 is of a conventional design and is depicted as a grid which is configured to prevent inadvertent or accidental displacement of chips from pockets 54 when the cover 60 is attached to carrier tray 10.

Referring to FIGS. 8 and 9, the method of attaching a retainer or cover to a carrier tray will be discussed. Turning to FIG. 8, the cover 60 has been positioned onto tray 10 in a first seated position by moving the cover 60 into contact with the tray 10 along a vertical axis Z. In this position, the rails 72 and 74 of cover 60 are in sliding contact with the rails 22 and 24 of the tray 10. Note that the posts 76, 78, 80, and 82 of the cover 60 project into notches 26, 28, 30, and 32 of tray 10. Also note that in this first seated position, the cover 60 is linearly offset with respect to the tray 10 along the Y axis. Thus, in this first seated position, the posts 76, 78, 80, and 82 are positioned adjacent to one side of notches 26, 28, 30, and 32. Although the offset depicted is about the distance of one pocket or cell, it is understood that other offsets may be used without departing from the spirit and scope of the invention.

Turning to FIG. 9, in the second step of attaching the cover or retainer 60 to a tray 10, the cover 60 is moved into a second seated position by sliding the cover 60 in the Y direction thereby bringing the first peripheral frame 12 of tray 10 and the second peripheral frame 62 of cover 60 into coincident relation.

Separation of the cover or retainer 60 from the chip carrier tray 10 is the reverse procedure. That is, the cover 60 and the tray 10 are first slidingly displaced from each other along the Y axis until the posts 76, 78, 80, and 82 are adjacent to one side of notches 26, 28, 30, and 32. Then, the cover 60 and the tray 10 are separated from each other along the Z axis.

Although the trays depicted are quadrilateral in shape, other tray and cover shapes may be used; for example, circles. In the case of circular trays and retainers, it is envisioned that the fastening elements be appropriately configured so that attachment may be accomplished by rotational movement.

Figure 10:
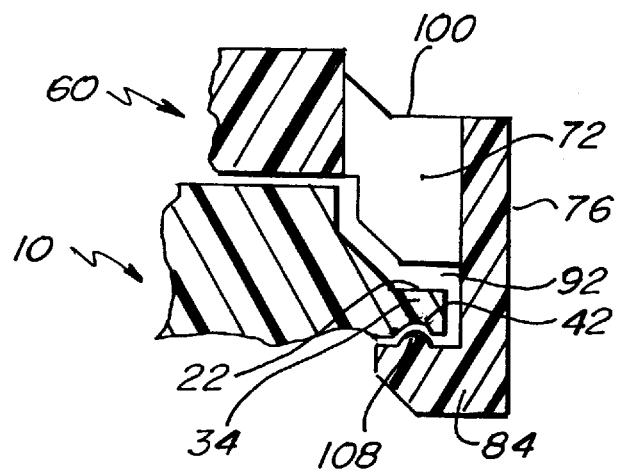
FIG. 10 is a partial, sectional view of a flange engaging tab.

Referring to FIG. 10, the elements for lockably engaging a retainer or cover to a tray can be seen. Here, the tab 34 of tray 10 is provided with element or recess 42 which is configured to engage the element or projection 108 of the flange 84 of the cover 60. When the cover 60 and the tray 10 are moved from the first seated position to the second seated position, the flanges 84, 86, 88, and 90 of the cover 60 engage the tabs 34, 36, 38, and 40 of carrier tray 10. Thus, vertical displacement of the cover 60 relative to the tray 10 is prevented. As the cover 60 and the tray 10 approach the second seated position, the projections 108, 110, 112, and 114 of flanges 84, 86, 88, 90 cause the flanges and the tabs 34, 36, 38, 40 to resiliently deflect. As the projections encounter the recesses 42, 44, 46, and 48 of the tabs, the tabs and flanges spring back to their undeflected state to lock the cover relative to the tray. The projections and recesses need not be large, as there are four sets of elements which lockably engage with each other. However, it is understood that the locking elements may vary in shape and number without departing from the scope of the invention.

Figure 11:
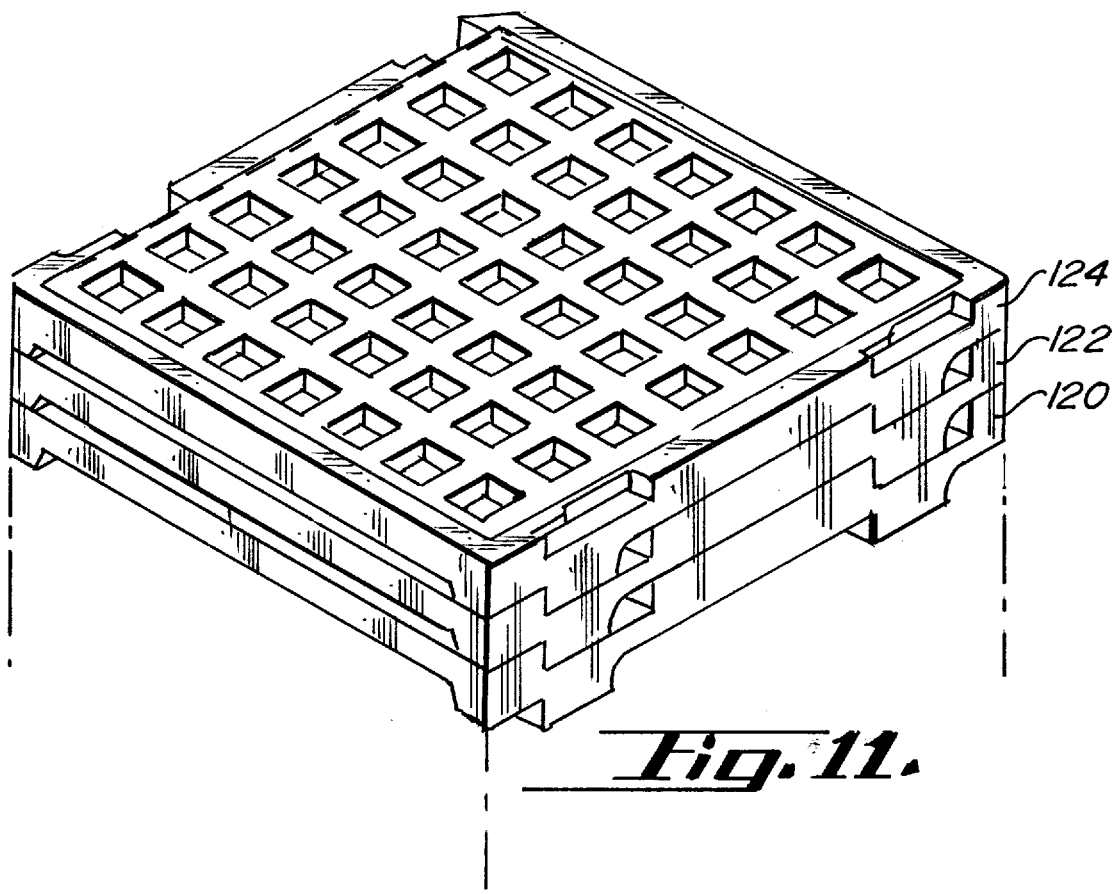
FIG. 11 is a perspective view of a plurality of trays in a stacked, attached relation.

Referring to FIG. 11, a second embodiment depicts a plurality of carrier trays 120, 122 and a cover 124 attached to each other in a stacked relation. Here, the trays 120, 122 are provided with posts and flanges similar to the posts and flanges as discussed above. This provision enables a tray to function in the normal fashion and enables a tray to function as a retainer. This embodiment enables various combinations of trays to be combined as the situation demands.

The present invention may be embodied in other specific forms without departing from the spirit or essential attributes thereof; and it is, therefore, desired that the present embodiment be considered in all respects as illustrative and not restrictive, reference being made to the appended claims rather than to the foregoing description to indicate the scope of the invention.

We claim:

1. A semi-conductor chip carrier for processing and transporting a plurality of semi-conductor chips, the carrier comprising:

a. a tray, the tray having a first peripheral frame and a chip support surface, the first peripheral frame having a plurality of notches and a plurality of tabs; and, b. a cover, the cover having a second peripheral frame and a chip retaining surface, the second peripheral frame having a plurality of orthogonally extending posts configured to project into the notches of the first peripheral frame for constrained linear motion, the posts including a plurality of flanges;

wherein placement of the cover onto the tray and aligning the first and second peripheral frames with respect to each other brings the plurality of flanges into locking engagement with the plurality of tabs thereby removably attaching the cover to the tray.

2. The carrier of claim 1, wherein the notches of the first peripheral frame are in opposed relation.

3. The carrier of claim 2, the notches having first and second ends, the plurality of tabs adjacent the first ends of the notches.

4. The carrier of claim 3, each tab having a downwardly facing portion, and each flange having an upwardly facing portion, wherein the downwardly facing portions and the upwardly facing portions are brought into and out of engagement as the first and second peripheral frames are aligned.

5. The carrier of claim 4, wherein the tabs and the flanges include elements for interlocking the cover relative to the tray.

6. The carrier of claim 5, wherein the elements for interlocking comprise recesses and detents.

7. A semi-conductor chip carrier system for processing and transporting a plurality of semi-conductor chips, the carrier comprising:

a. at least one tray, the tray having a first peripheral frame and a chip support surface, the first peripheral frame having a plurality of notches, a plurality of tabs, and a plurality of orthogonally extending posts configured to project into notches of a peripheral frame of another tray, the posts configured for constrained linear motion within the notches, the posts including a plurality of flanges; and, b. a cover, the cover having a second peripheral frame and a chip retaining surface, the second peripheral frame having a plurality of orthogonally extending posts configured to project into the notches of the first peripheral frame for constrained linear motion therein, the posts including a plurality of flanges;

wherein placement of the cover onto the tray and alignment of the first and second peripheral frames with respect to each other brings the plurality of flanges into locking engagement with the plurality of tabs thereby removably attaching the cover to the tray; and, wherein placement of the tray onto another tray and alignment of the peripheral tray frames with respect to each other brings the plurality of flanges into locking engagement with the plurality of tabs thereby removably attaching the tray to another tray.

8. The carrier of claim 7, wherein the notches of the at least one tray are in opposed relation.

9. The carrier of claim 8, the notches having first and second ends, the plurality of tabs adjacent the first ends of the notches.

10. The carrier of claim 9, each tab having a downwardly facing portion, and each flange having an upwardly facing portion, wherein the downwardly facing portions and the upwardly facing portions are brought into and out of engagement as the peripheral frames are aligned.

11. The carrier of claim 10, wherein the tabs and the flanges include elements for interlocking the cover relative to the tray and the tray to another tray.

12. The carrier of claim 11, wherein the elements for interlocking comprise recesses and detents.

13. A semi-conductor chip carrier for processing and transporting a plurality of semi-conductor chips, the carrier comprising:

a. a first tray, the first tray having a first peripheral frame and a chip support surface, the first peripheral frame having a plurality of notches and a plurality of tabs; and, b. a second tray, the second tray having a second peripheral frame, a chip support surface and a chip retaining surface, the second peripheral frame having a plurality of orthogonally extending posts configured to project into the notches of the first peripheral frame for constrained linear motion, the posts including a plurality of flanges;

wherein placement of the second tray onto the first tray and aligning the first and second peripheral frames with respect to each other brings the plurality of flanges into locking engagement with the plurality of tabs thereby removably attaching the second tray to the tray.

14. The carrier of claim 13, wherein the notches of the first peripheral frame are in opposed relation.

15. The carrier of claim 14, the notches having first and second ends, the plurality of tabs adjacent the first ends of the notches.

16. The carrier of claim 15, each tab having a downwardly facing portion, and each flange having an upwardly facing portion, wherein the downwardly facing portions and the upwardly facing portions are brought into and out of engagement as the first and second peripheral frames are aligned.

17. The carrier of claim 16, wherein the tabs and the flanges include elements for interlocking the second tray relative to the first tray.

18. The carrier of claim 17, wherein the elements for interlocking comprise recesses and detents.

* * * * *